United States Patent
Ni et al.

(10) Patent No.: US 6,780,780 B2
(45) Date of Patent: Aug. 24, 2004

(54) METHOD FOR REMOVING SI-NEEDLES OF WAFER

(75) Inventors: Chih-Jung Ni, Hsinchu (TW); Jia-Shing Jan, Taipei (TW); Yueh-Liang Liu, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 10/335,294

(22) Filed: Dec. 31, 2002

(65) Prior Publication Data

US 2003/0170997 A1 Sep. 11, 2003

(30) Foreign Application Priority Data

Mar. 6, 2002 (TW) ........................................ 91104195 A

(51) Int. Cl.$^7$ ............................................ H01L 21/302
(52) U.S. Cl. ..................... 438/706; 438/708; 438/725; 438/745; 438/748; 438/753
(58) Field of Search ............................. 438/706, 708, 438/725, 745, 748, 753

(56) References Cited

U.S. PATENT DOCUMENTS

| | | | | |
|---|---|---|---|---|
| 5,874,366 A | * | 2/1999 | Sporer et al. | 438/748 |
| 6,162,739 A | * | 12/2000 | Sumnitsch et al. | 438/745 |
| 6,245,678 B1 | * | 6/2001 | Yamamoto et al. | 438/692 |
| 6,395,646 B1 | * | 5/2002 | Liu | 438/747 |
| 6,649,077 B2 | * | 11/2003 | Tsai et al. | 216/92 |

* cited by examiner

Primary Examiner—Nadine G. Norton
Assistant Examiner—Binh X. Tran
(74) Attorney, Agent, or Firm—Volpe and Koenig, P.C.

(57) ABSTRACT

This application is about a method for removing the deep trench Si-needles on a wafer. The method includes steps of forming a photoresist layer on a frontside surface of the wafer, removing a specific area of the photoresist layer for exposing the Si-needles, proceeding a first etching and a second etching, and finally removing the photoresist layer on the frontside surface of the wafer. The first etching is a wet etching for removing the Si-needles by an etching solution etching from a backside surface of the wafer back to the frontside surface of the wafer. And, the second etching is a dry etching for removing the residual silicon nitride (SiN) slices formed during the first etching.

18 Claims, 7 Drawing Sheets

METHOD FOR REMOVING SI-NEEDLES OF WAFER

FIELD OF THE INVENTION

This invention relates to a method for removing Si-needles of a wafer, and especially to one method for removing Si-needles formed during the manufacturing processes of deep trenches on the wafer.

BACKGROUND OF THE INVENTION

During the manufacturing processes of semiconductors, the main application of manufacturing deep trenches is to use wide surface areas to form the capacitors of dynamic random access memories (DRAMs). However, when deep trenches are formed on a wafer, the edges of the wafer do not be washed during the photolithography in order to improve the unity of the edges of the wafer etched by the dry etching and the chemical mechanical polishing. Because the edges of the wafer do not be washed, the yellow light will defocus on the edges of the wafer, and after the manufacturing processes of a reactive ion etching, the Si-needles will be produced. The Si-needles are silicon needle substances and kinds of ancillary products from ill-manufacturing processes of the deep trenches. If the Si-needles are not removed, they will become particle sources and reduce the yields at a level of 15%.

Please refer to FIG. 1(a). FIG. 1(a) is a flow chart of removing the deep trench Si-needles according to the prior art. At first, a photoresist layer on the frontsideside surface of the wafer is formed for protecting the patterns and the edges of the wafer are washed at a distance about 2 mm. Then, the Si-needles are removed by a chemical dry etching. Finally, the photoresist layer is removed.

Please refer to FIG. 1(b). FIG. 1(b) is a schematic diagram of the area washed during the process of washing edge in FIG. 1(a). In which, the reference number 11 denotes the pattern unit, the reference number 12 denotes the area covered by the photoresist, the number 13 denotes the area uncovered by the phototresist, the reference number 14 denotes the edge of the wafer, and the reference number 15 denotes the boundary of the area washed during the process of washing edge. If the shapes of the deep trenches uncovered by the photoresist layer in the area 13 are not removed completely by the chemical dry etching, what is called shell-model defect will be produced. Because the trenches of the wafer become deeper from generation to generation during the manufacturing processes and the Si-needles always deposit after the manufacturing processes of the deep trenches, it is necessary to extend the etching time of the chemical dry etching for removing the Si-needles completely.

Besides, the disadvantages of the methods for removing the Si-needles according to the prior arts are time consumption and high cost. For example, when the deep trench Si-needles formed from the manufacturing processes of a 0.175 μm semiconductor are removed, the etching time of each wafer is 270 seconds (4.5 minutes), so that each lot of wafers will cost 6480 seconds (108 minutes)=1.8 hours. The total manufacturing time including etching, transfer, pumping down, and vent etc. steps of each lot of wafers is 4 hours. Thereto, it's necessary to rotate the quartz tube of the chemical dry etching tool once after the quartz tube thereof is used per 13 hours. Moreover, the quartz tube must be replaced and the Teflon transfer tube must be cleaned once after the quartz tube and the Teflon transfer tube are used per 52 hours. Therefore, the frequencies of the preventive maintenance of the chemical dry etching tool and the consumption of quartz tubes will increase rapidly when the manufacturing time of each lot of wafers extends.

Because of the technical disadvantage described above, the applicant keeps on carving unflaggingly to develop "method for removing the deep trench Si-needles of wafer" through wholehearted experience and

SUMMARY OF THE INVENTION

It is an object of the present invention to provide a method for removing the Si-needles from the manufacturing processes of the deep trenches of a wafer.

It is another object of the present invention to provide a method for removing the deep trench Si-needles from the manufacturing processes of a wafer with less time and less cost.

The present invention provides a method for removing Si-needles formed during the processes of manufacturing deep trenches on a wafer. The method includes steps of forming a photoresist layer, removing a specific area of the photoresist layer, proceeding a first etching and a second etching and finally removing the photoresist layer on the frontside surface of the wafer. Forming a photoresist layer means to form a photoresist layer on a frontside surface of the wafer. Removing a specific area of the photoresist layer is used for exposing the Si-needles. The first etching is used for removing the SI-needles by an etching solution etching from a backside surface of the wafer back to the frontside surface of the wafer, and the second etching is used for removing the residual slices.

Preferably, the Si-needles are disposed around periphery of the wafer.

Preferably, the Si-needles are produced during a manufacturing process of the wafer.

Preferably, the step of removing a specific area of the photoresist layer is by means of washing away photoresist on the edge of a wafer.

Preferably, the first etching is a wet etching used to remove the Si-needles.

Preferably, the residual slices are silicon nitride (SiN) slices.

Preferably, the second etching is a dry etching used to remove the residual slices.

Preferably, the specific area is 1 mm to 2 mm away from the edge of the wafer.

Preferably, the photoresist layer covers and protects an area of dummy patterns from being etched by the etching solution.

Preferably, the step of the first etching further includes steps of turning the frontside surface of the wafer downward to be placed on a wafer chuck having pluralities of chuck pins in a wafer-backside etching machine, holding the wafer tightly with the chuck pins, protecting patterns of the wafer having the frontside surface downward by nitrogen gas ($N_2$) and etching an upward backside surface of the wafer. Etching the upward backside surface of the wafer includes a step of removing the Si-needles by the etching solution via an action of etching from the backside surface of the wafer backside to the frontside surface of the wafer.

Preferably, the wafer-backside etching machine has a working surface raised by a packing.

Preferably, the working surface has a flange structure on an edge thereof.

Preferably, the flange structure and the chuck pins have a naked zone therebetween.

Preferably, the naked zone is etched during the etching back process of the etching solution.

Preferably, the first etching further includes a step of raising the chuck pins for holding the wafer after the working surface is raised.

Preferably, after the first etching the manufacturing process further includes a displacement process to readjust a position where the chuck pins hold the wafer for completely removing the Si-needles originally covered by the chuck pins.

Preferably, the displacement process includes steps of opening the chuck pins for releasing the wafer, accelerating the wafer chuck, decelerating the wafer chuck, closing the chuck pins for holding the wafer, and proceeding the first etching again for etching the Si-needles originally covered by the chuck pins.

Preferably, the positions of the wafer originally held by the chuck pins are exposed via the displacement process.

Preferably, the second etching is a reactive ion etching.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

Figure 1A:
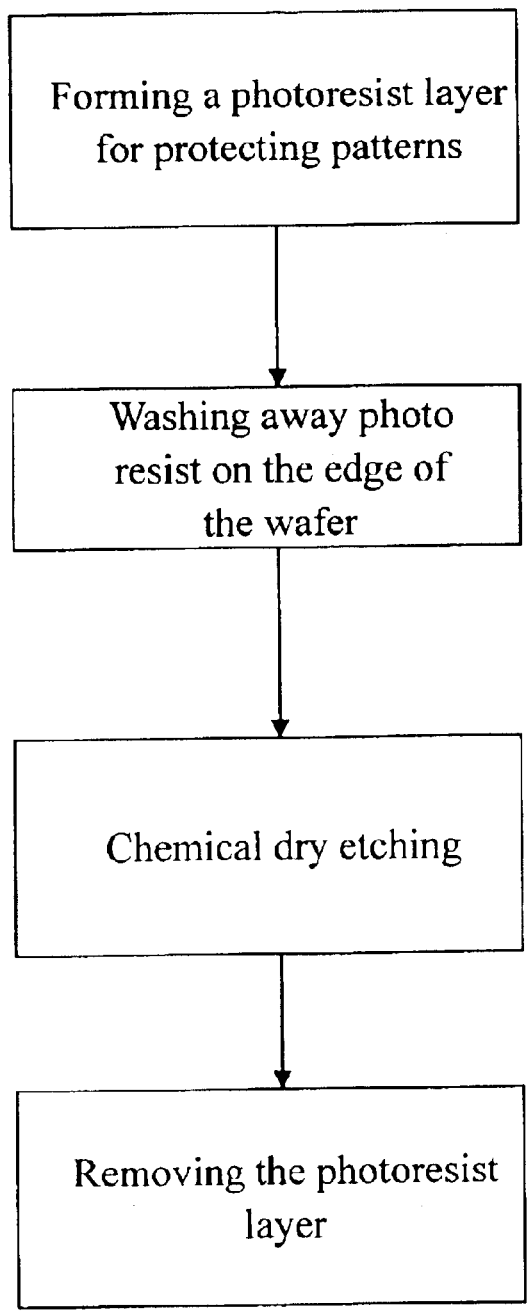
FIG. 1(a) shows a flow chart of removing the deep trench Si-needles of prior arts.
Figure 1B:
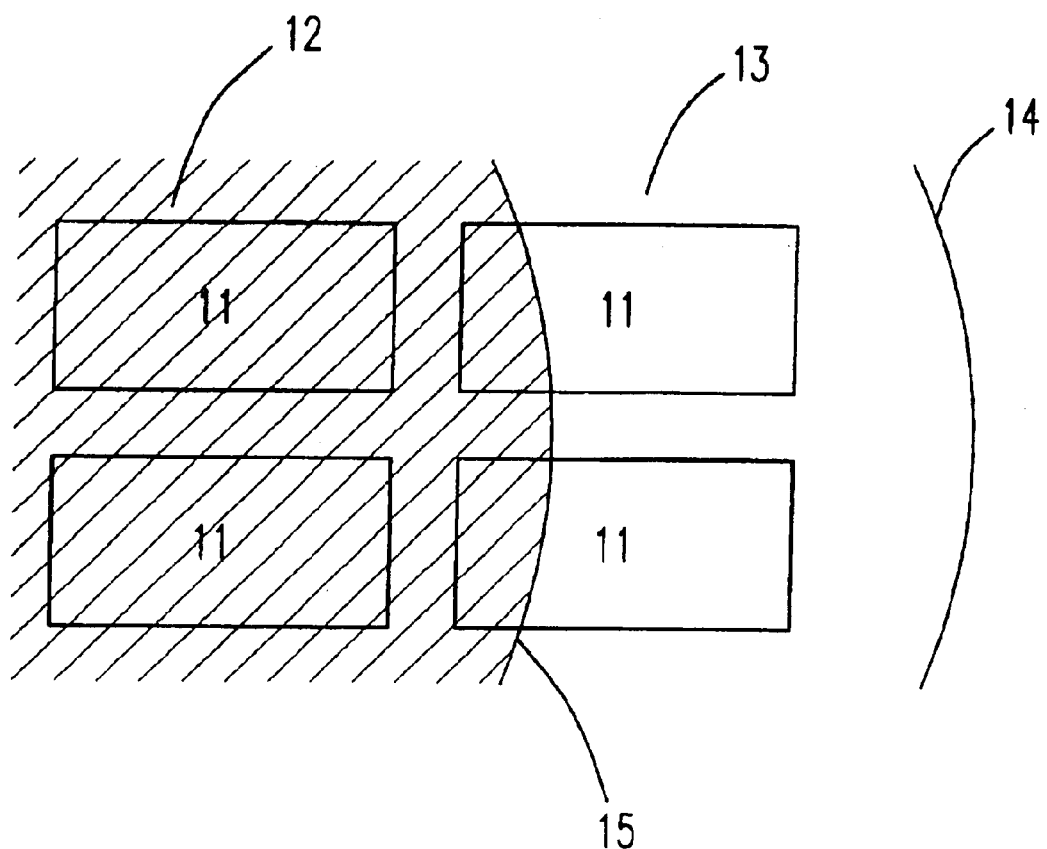
FIG. 1(b) shows a schematic diagram of the areas washed during the process of washing edges in FIG. 1(a)
Figure 2A:
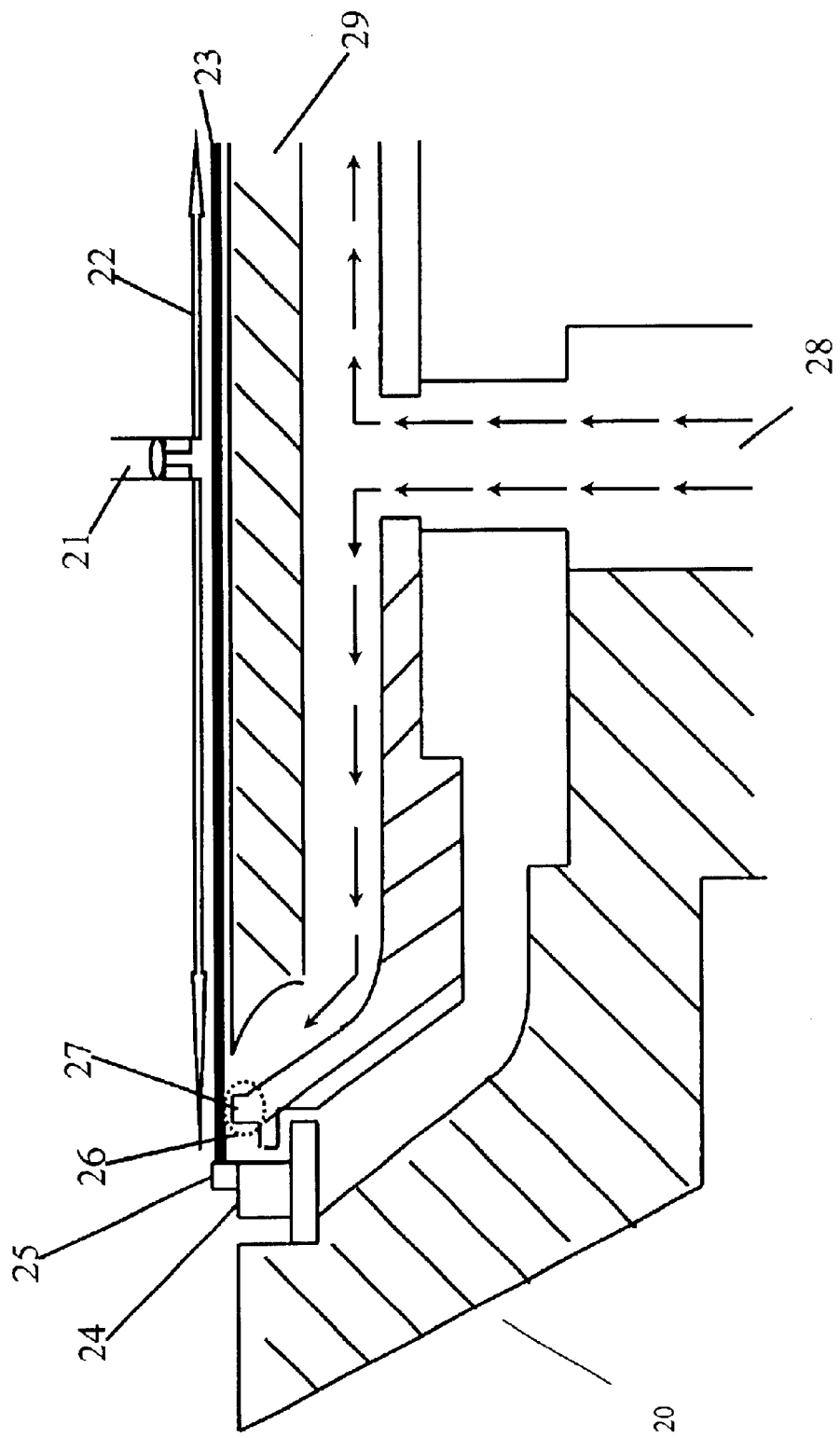
FIG. 2(a) shows a schematic diagram of the first etching according to a preferred embodiment of the present invention.

Please refer to FIG. 2(a). FIG. 2(a) shows a schematic diagram of the first etching. The first etching is a wet etching for removing the Si-needles by the etching solution etching from the backside surface of the wafer 23 back to the frontside surface of the wafer 23. The first etching includes steps as follows. At first, the frontside surface of the wafer 23 is turned downward to be placed on a wafer chuck 24, which has six chuck pins 25. Meanwhile, the wafer is held tightly by the chuck pins 25 in a wafer-backside etching machine 20. Secondly, the patterns of the wafer 23 with the frontside surface downward is protected by nitrogen gas ($N_2$) 28. Finally, the upward backside surface of the wafer 23 is etched and the Si-needles is removed by the etching solution 22 via an action of etching from the backside surface of the wafer 23 back to the frontside surface of the wafer 23.

The working surface 29 of the wafer-backside etching machine 20 is raised by a packing. The working surface 29 has a flange 27 on the edge thereof. There is a naked zone 26 between the flange 27 and the chuck pins 25 and the naked zone 26 is the zone etched during the etching back process of the etching solution 22. The manufacturing processes include controllable parameters such as the flux of the etching solution 22, the operation temperature, the rotation speed of the wafer chuck 24, the flux of the nitrogen gas 28, the scanning range of the nozzle of the etching solution 21, the scanning speed of the nozzle of the etching solution 21 and the etching time etc. One preferred embodiment of the present invention, the parameters of the manufacturing processes can be regulated by the methods such as slowly rotating of the wafer chuck 24, reducing the flux of the nitrogen gas 28, increasing the flux of the etching solution 22, extending the etching time and adjusting the scanning range of the nozzle of the etching solution 21 to become closer to the edges of the wafer 23 etc.

Figure 2B:
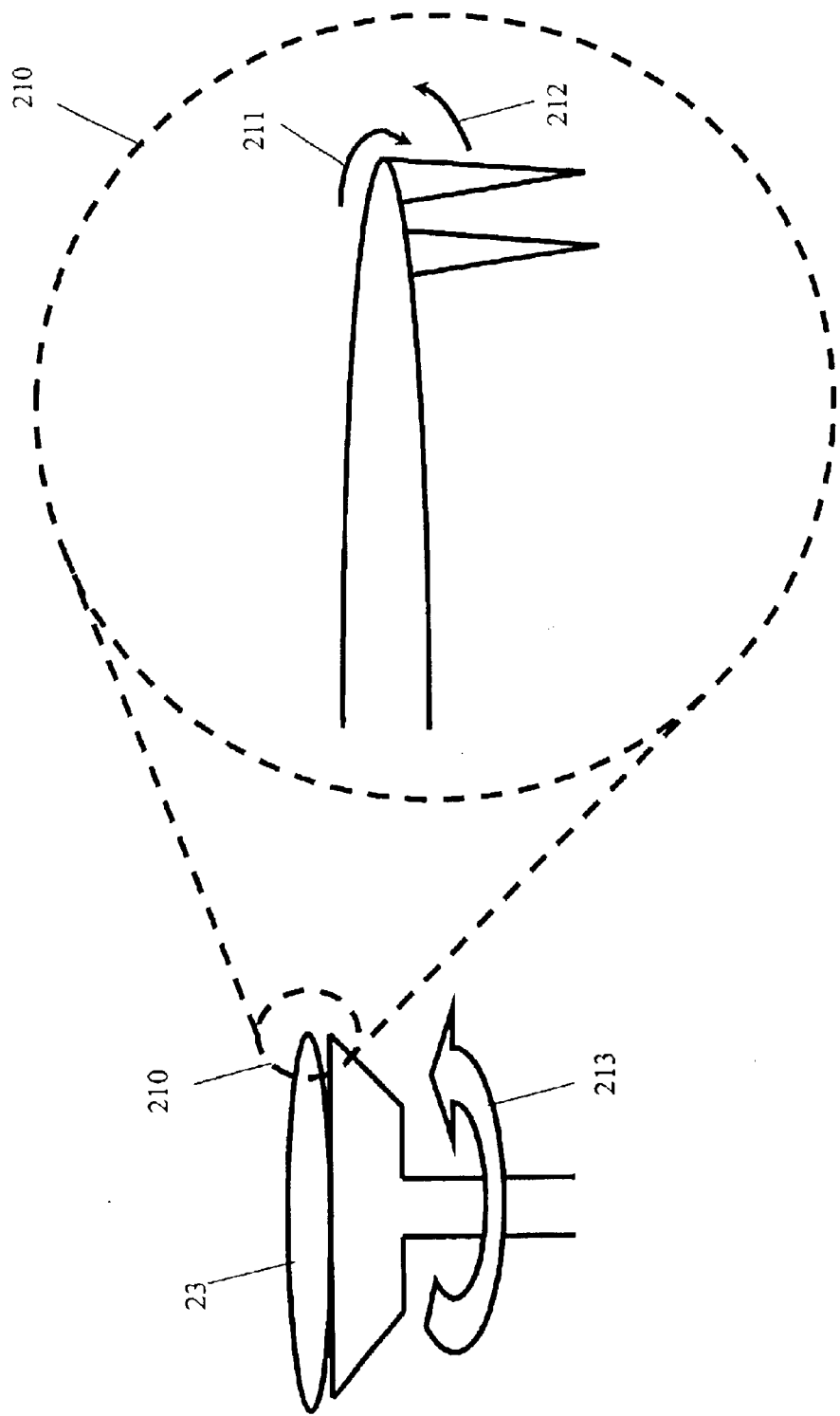
FIG. 2(b) shows a schematic diagram of removing the Si-needles by the etching back process of the etching solution.

Please refer to FIG. 2(b). FIG. 2(b) is a schematic diagram of removing the Si-needles by the etching back process of the etching solution. After the etching solution 22 etches the roots of the Si-needles 211, the Si-needles with broken roots will be flung from the surface of the wafer 23 by the rotational centrifugal force 212 of the wafer chuck 24. The mechanisms of removing the Si-needles include the chemical reaction (etching back the roots of the Si-needles to break the roots) and the mechanical force (removing the Si-needles having broken roots by the rotational centrifugal force). Because the traditional methods for removing the Si-needles by the chemical dry etching have only the chemical reaction but without mechanical reaction that the Si-needles are easily remained.

Figure 3:
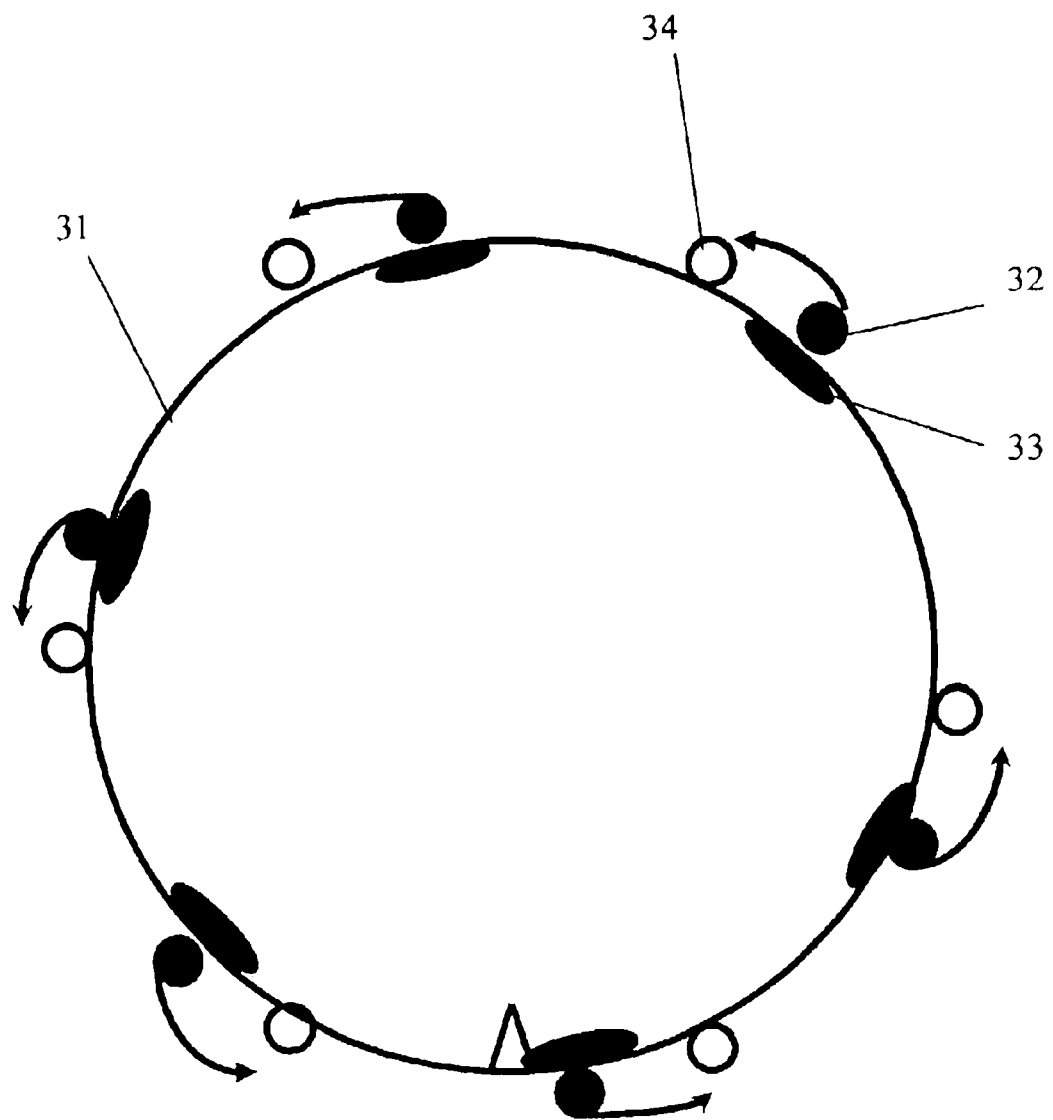
FIG. 3 shows a schematic diagram of removing the Si-needles originally covered by six chuck pins and not fully removed by the etching solution according to a preferred embodiment of the present invention.

Please refer to FIG. 3. FIG. 3 is a schematic diagram of removing the Si-needles originally covered by the six chuck pins and not fully removed by the etching solution after the first etching. Modifying the software of the machine is one way for further removing the Si-needles residue 33 originally covered by the six chuck pins and not fully removed by the etching solution. After the first etching, a displacement process is used to readjust the positions where the chuck pins hold the wafer for completely removing the Si-needles residue 33 originally covered by the six chuck pins and not fully removed by the etching solution. The displacement process includes steps as follows. At first, the six chuck pins are opened for releasing the wafer. Secondly, the wafer chuck is accelerated and then decelerated and the six chuck pins are closed for holding the wafer. Finally, the first etching is used again for removing the Si-needles residue 33 originally covered by the chuck pins. Because of the inertia, the wafer 31 will not be flung from the wafer chuck and there is a relative displacement between the wafer 31 and the six chuck pins after the displacement process. The relative displacement readjusts the positions where the six chuck pins hold the wafer 31. Please refer to FIG. 3. After the displacement process of the wafer, the positions 32 originally held by the chuck pins will be moved to new positions 34 and the Si-needles residue 33 can be removed completely.

Because the etching solution etches silicon of the wafer quickly that the silicon nitride (SiN) of the hard mask will be drifted and some of the SiN slices will be flung from the wafer by rotational centrifugal force and others will still be attached on the wafer. The attached SiN slices on the wafer have to be removed to avoid forming another particle source that will pollute the following manufacturing processes. A second etching is used to remove the SiN slices uncovered by the photoresist layer. The second etching is a dry etching and a reactive ion etching.

Figure 4:
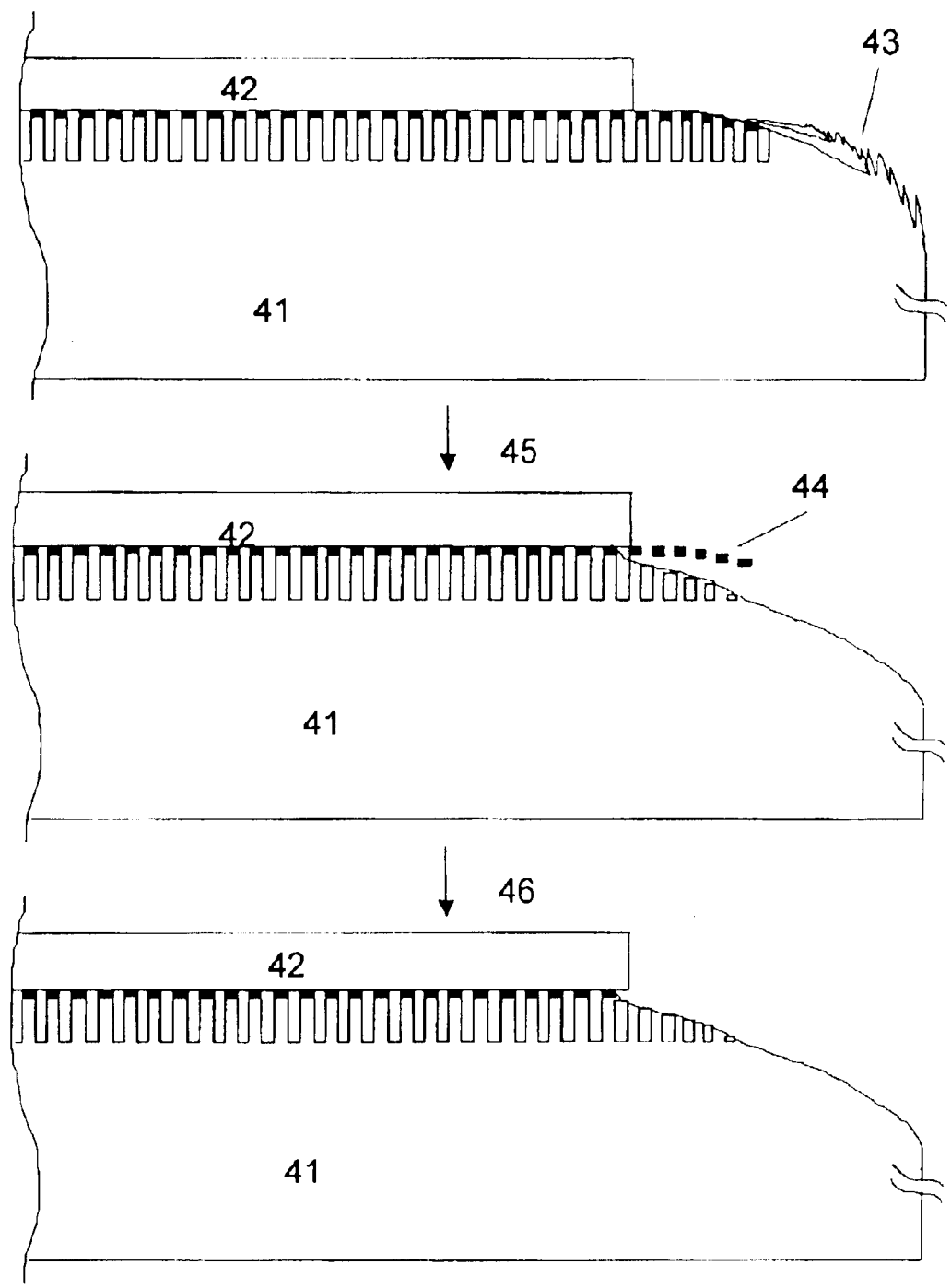
FIG. 4 shows a schematic diagram of the action according to a preferred embodiment of the present invention.

Please refer to FIG. 4. FIG. 4 is a schematic diagram of the action of the present invention. At first, a photoresist layer 42 is formed on the frontside surface of the wafer 41. Secondly, a specific area of the photoresist layer is removed by means of washing away photoresist on the edges for exposing the Si-needles 43. Finally, the process of the first etching 45 is used on the wafer 41. The first etching 45 is a wet etching for removing the Si-needles 43 by the action of the etching solution etching from the backside surface of the wafer 41 back to the frontside surface of the wafer 41. Furthermore, the process of the second etching 46 is used on the wafer 41. The second etching 46 is a dry etching and a reactive ion etching for removing the SiN slices 44 formed during the first etching 45. Finally, the photoresist layer 42 on the frontside surface of the wafer 41 is removed.

Figure 5:
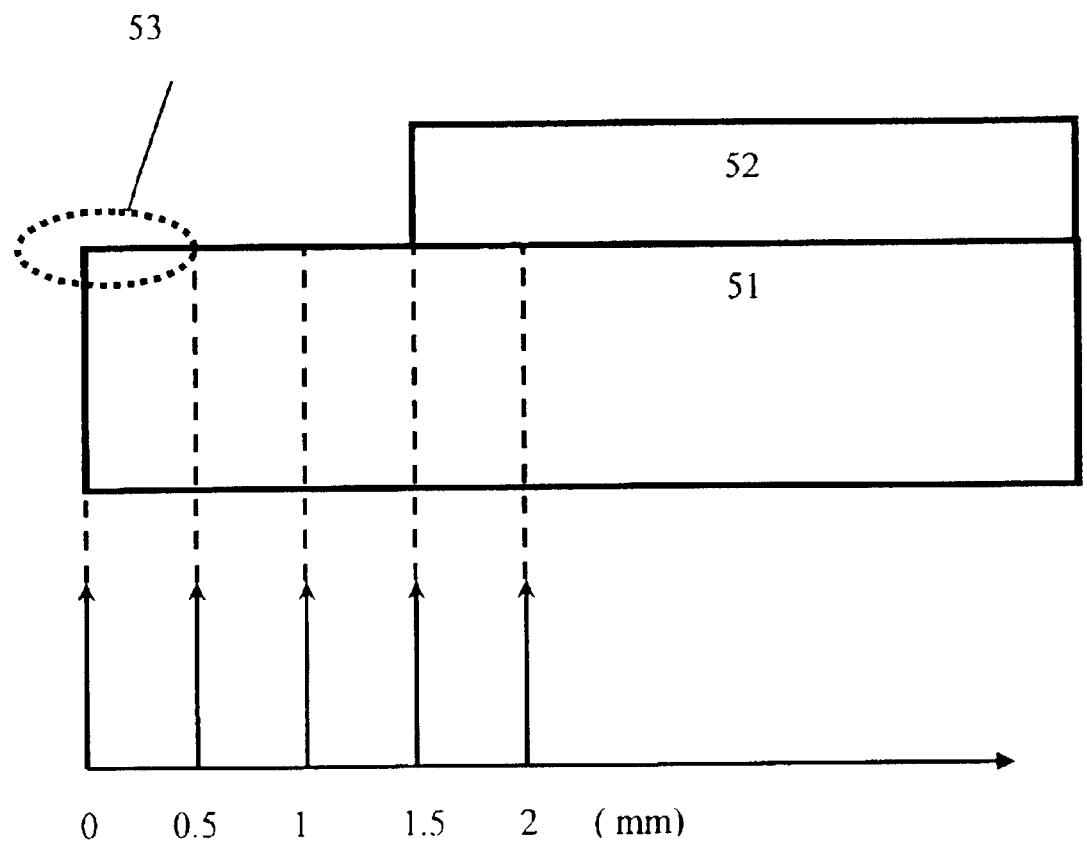
FIG. 5 shows a side view of the area washed during the process of washing edges according to a preferred embodiment of the present invention.

Please refer FIG. 5. FIG. 5 is a side view of the areas washed during the process of washing edges of the present invention. The Si-needles 53 are in the areas range from 0 to 0.5 mm away from the edge of the wafer. The photoresist layer 52 is coated to protect the surfaces of the wafer and the areas are washed from 1.5 to 2.5 mm away from the edge of the wafer for exposing the Si-needles. The Si-needles 53 are removed by the first etching and the SiN slices are removed by the second etching. In general, the areas of the frontside surfaces etched by a wafer-backside etching machine are set to be 2 mm from the edge of the wafer for completely covering the areas of the Si-needles 53. However, to avoid the dummy deep trench patterns in the areas without Si-needles and protection of the photoresist layer 52 being etched overly by the etching solution, it's better to readjust the areas washed by the washing edges. When the dummy deep trench patterns are etched overly and sprayed to the inside of the wafer 51 in the following manufacturing processes (such as immersing into the wet bench), the products of the semiconductors will be polluted and the yields of the products will be reduced. After experiments, it's known that it's better to move the washed areas out for a distance of 0.5 mm when the area of the wafer etched by the etching back reaction of the etching solution is from 0 to 2 mm away from the edge of the wafer. Then the washed areas will be ranged from 1 mm to 2 mm away from the edge of the wafer. As shown in FIG. 5, it can be ensured that the areas etched by the etching back reaction of the etching solution will overlap the photoresist layers at a distance of 0.5 mm for reducing the ratios or areas of the dummy deep trench patterns etched by the etching solution.

As given above, the invention is a method for removing the Si-needles via a first etching (wafer backside etching) and a second etching (reactive ion etching) to replace the traditional chemical dry etching. It is possible to remove the Si-needles effectively and to avoid the lost of the yields at a level of 15% by the methods of modifying the software and hardware of the wafer backside etching machine and controlling the parameters of the manufacturing processes. Besides the above-mentioned, it will be possible to save the cost of the chemical dry etching tools, to shorten the time of etching, to reduce the cost of the quartz tubes and to decrease the frequencies of the preventive maintenance by methods of modifying the software and the hardware of the etching machine and controlling the parameters. The purposes of this invention are to provide a method for effectively improving the defaults of prior arts and being worthy of the industries.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A method for removing Si-needles of a wafer, comprising steps of:
    forming a photoresist layer on a frontside surface of said wafer;
    removing a specific area of said photoresist layer for exposing said Si-needles;
    proceeding a first etching for removing said Si-needles by an etching solution etching from a backside surface of said wafer back to said frontside surface of said wafer;
    proceeding a second etching for removing residual slices; and
    removing said photoresist layer on said frontside surface of said wafer.

2. The method as claimed in claim 1, wherein said Si-needles are disposed around a periphery of said wafer.

3. The method as claimed in claim 1, wherein said Si-needles are produced during a manufacturing process of said wafer.

4. The method as claimed in claim 1, wherein said removing a specific area of said photoresist layer is by means of washing away photoresist on the edges.

5. The method as claimed in claim 1, wherein said first etching is a wet etching for removing said Si-needles.

6. The method as claimed in claim 1, wherein said residual slices are Si—N slices.

7. The method as claimed in claim 1, wherein said second etching is a dry etching for removing said residual slices.

8. The method as claimed in claim 1, wherein said specific area is 1 mm to 2 mm away from the edge of said wafer.

9. The method as claimed in claim 1, wherein said photoresist layer covers and protects an area of dummy patterns from being etched by said etching solution.

10. The method as claimed in claim 1, wherein said step of proceeding said first etching comprise steps of:
    turning said frontside surface of said wafer downward to be placed on a wafer chuck having pluralities of chuck pins in a wafer-backside etching machine; holding said wafer tightly with said chuck pins;
    protecting patterns of said wafer having said frontside surface downward by nitrogen gas ($N_2$); and
    etching an upward backside surface of said wafer and removing said Sineedles by said etching solution via an action of etching from said backside surface of said wafer back to said frontside surface of said wafer.

11. The method as claimed in claim 10, wherein said wafer-backside etching machine has a working surface raised with a packing.

12. The method as claimed in claim 11, wherein said working surface has a flange structure on an edge thereof.

13. The method as claimed in claim 12, wherein said flange structure and said chuck pins have a naked zone therebetween.

14. The method as claimed in claim 13, wherein said naked zone is a zone etched during the etching back process of said etching solution.

15. The method as claimed in claim 10, further comprising a step of raising said chuck pins for holding said wafer after said working surface is raised.

16. The method as claimed in claim 10, further comprising a displacement process after said first etching to readjust a position where said chuck pins hold said wafer for completely removing said Si-needles originally covered by said chuck pins, wherein said displacement process comprises steps of:

opening said chuck pins for releasing said wafer;

accelerating said wafer chuck;

decelerating said wafer chuck, closing said chuck pins for holding said wafer; and proceeding said first etching again for etching said Si-needles originally covered by said chuck pins.

17. The method as claimed in claim 16, wherein said position of said wafer originally held by said chuck pins are exposed via said displacement process.

18. The method as claimed in claim 1, wherein said second etching is a reactive ion etching.

* * * * *